United States Patent [19] [11] 3,796,942
Bynum [45] Mar. 12, 1974

[54] INTEGRATED CIRCUIT FREQUENCY TO VOLTAGE CONVERTER

[75] Inventor: Byron Glen Bynum, Dallas, Tex.
[73] Assignee: Texas Instruments Incorporated, Dallas, Tex.

[22] Filed: Jan. 2, 1973
[21] Appl. No.: 320,332

[52] U.S. Cl. .......... 321/6, 317/5, 321/60, 328/140
[51] Int. Cl. .......... H02m 7/00
[58] Field of Search .......... 307/216; 317/5; 328/140; 321/4, 6, 60, 65, 69

[56] References Cited

UNITED STATES PATENTS

| | | | |
|---|---|---|---|
| 3,038,130 | 6/1962 | Gordon | 328/140 X |
| 3,340,883 | 9/1967 | Peternel | 317/5 X |
| 3,529,232 | 9/1970 | Porter et al. | 321/60 |
| 3,611,109 | 10/1971 | Jones | 321/69 R |
| 3,671,876 | 6/1972 | Oshiro | 307/216 X |
| 3,675,126 | 7/1972 | Chilton | 317/5 X |
| 3,680,655 | 8/1972 | Beyerlein et al. | 317/5 X |

*Primary Examiner*—William M. Shoop, Jr.
*Attorney, Agent, or Firm*—Harold Levine; Andrew M. Hassell; William E. Hiller

[57] ABSTRACT

Disclosed is a frequency to voltage converter especially suitable for integrated circuit application in providing a DC signal having magnitude related to and varying with the frequency of a variable input signal over a wide range of device and environmental conditions. A squaring circuit in response to the variable input signal provides a first train of squared pulses to a pulse generator which generates a second train of pulses time displaced therefrom. A first current generator controls the pulse generator so as to provide the second train of pulses with a predetermined pulse width. A second current source tracking the first current source is responsive to the second pulse train for generating a third pulse train in direct frequency proportion thereto having an amplitude variable so as to compensate for pulse width changes. The third pulse train is accordingly comprised of pulses of substantially constant energy. An integrator thereupon integrates the regulated third pulse train into a DC signal of magnitude varying with the frequency of the input signal.

8 Claims, 6 Drawing Figures

INTEGRATED CIRCUIT FREQUENCY TO VOLTAGE CONVERTER

This invention relates to frequency converters in general and, more specifically, to frequency converters of the type utilizing an integrator for integrating a variable frequency square wave signal of regulated energy representative of the variable frequency input signal to provide the DC output signal representative of frequency.

In many dynamic control systems, there is a need to rapidly and accurately convert the frequency of an input signal into a voltage proportional thereto. One such system is a vehicle skid control braking system of the type which selectively inhibits the normal braking action initiated by the operator of the land vehicle. In one such system, wheel speed sensors are utilized to generate AC signals that are proportional to vehicle wheel speed. The vehicle wheel speed signals are then processed through a control module which generates a DC voltage to energize a solenoid in an actuator that controls the hydraulic braking system to the vehicle's wheels. The control module includes a frequency converter for each wheel speed sensor for converting a frequency varying signal into a varying direct current signal proportional thereto.

The above-described system is specifically set forth in copending patent application Ser. No. 025,131, filed Apr. 2, 1970, for "VEHICLE SKID CONTROL SYSTEM," which is assigned to the assignee of this application.

A detailed description of a prior frequency converter especially adapted for use in a vehicle skid control system is set forth in U.S. Pat. No. 3,611,109, issued Oct. 5, 1971, for "FREQUENCY CONVERTER," in the name of James J. Jones.

A frequency converter designed in integrated circuit form must accurately function over a wide range of temperature and environmental conditions in a skid control braking system. As is well known, integrated circuits are inherently sensitive to temperature and environmental conditions. Furthermore, lack of exact integrated circuit process controllability has necessitated circuit design requiring a generally broad range of tolerances, thereby providing generally variant circuits having variant electrical operating characteristics. Still further, circuit design requiring precise amount of capacitance has generally been avoided due to the necessity of utilization of externally supplied capacitive elements. Such external elements must obviously be electrically connected in external pin connections on the integrated circuit package. Since the number of package connections is limited, the number of externally supplied elements requiring connection to the package is preferably minimized. Accordingly, frequency to voltage converters requiring several externally supplied capacitors provide less than optimum integrated circuit designs, such as the frequency converter disclosed in the above-mentioned U.S. Pat. No. 3,611,109 which utilizes a pair of capacitors in a double differentiation technique.

It is therefore an object of the present invention to provide a frequency converter adapted for integrated circuit utilization.

It is another object of the present invention to provide an integrated circuit frequency to voltage converter utilizing a pair of tracking current sources so as to provide a compensated DC signal notwithstanding environmental and manufacturing variances.

SUMMARY OF THE INVENTION

A frequency to voltage converter utilizes an exclusive OR logic circuit to provide a pulse train representative of the frequency of an input signal of varying frequency. A squaring circuit provides a first train of squared pulses from the variable frequency input signal, and a pulse generator in response to the first train of pulses generates a time displaced second train of pulses. The first and second pulse trains are combined in an exclusive OR logic combination to thereby generate a third pulse train having controlled pulse widths. The third pulse train is thereupon integrated into a DC signal having magnitude related to and varying with the frequency of the input signal.

In a preferred embodiment especially suitable for integrated circuit application, first and second tracking current sources are responsive to the first and third pulse trains so as to control pulse width and pulse height of the waveform eventually integrated to provide the desired DC output signal.

The novel features believed to be characteristic of this invention are set forth in the appended claims. The invention itself, however, as well as other objects and advantages thereof may best be understood by reference to the following detailed description when read in conjunction with the accompanying drawings wherein:

Figure 1:
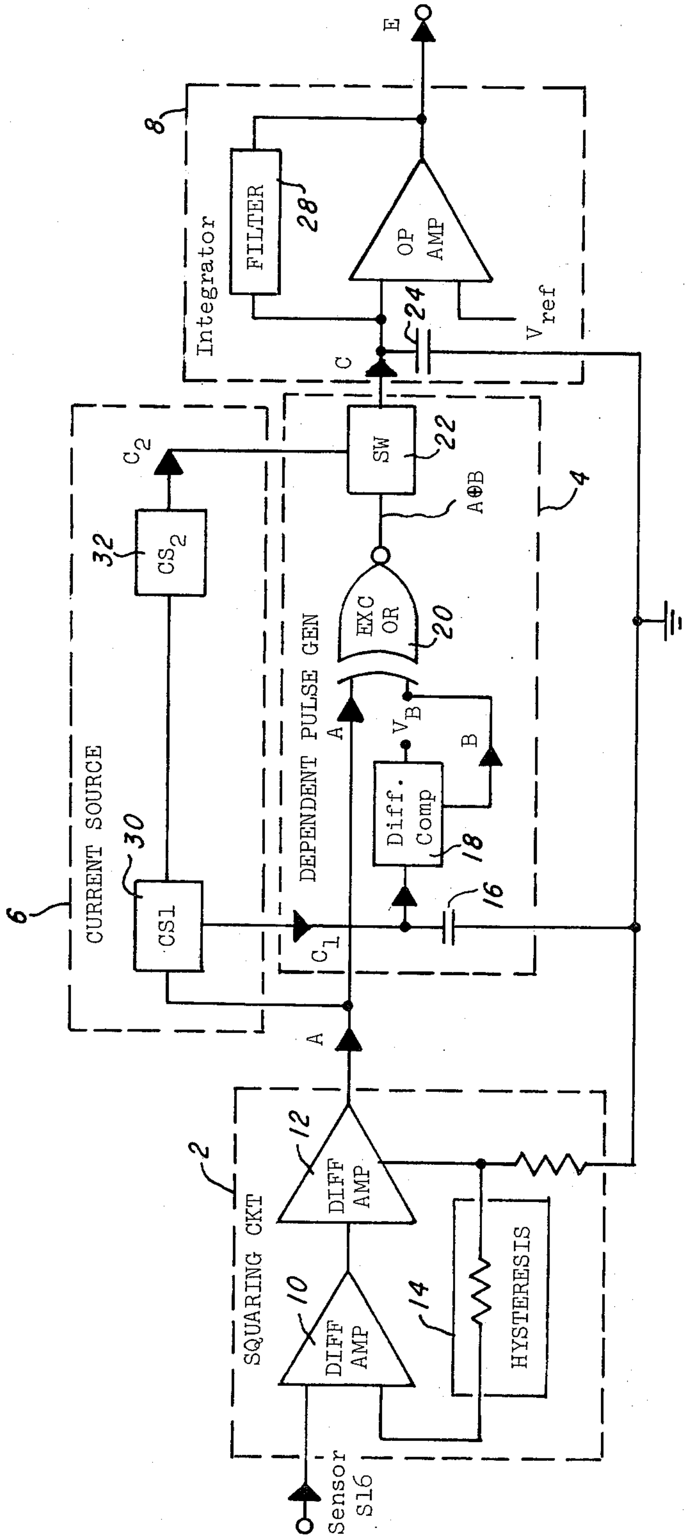
FIG. 1 depicts one embodiment of the frequency to voltage converter of this invention.
Figure 2:
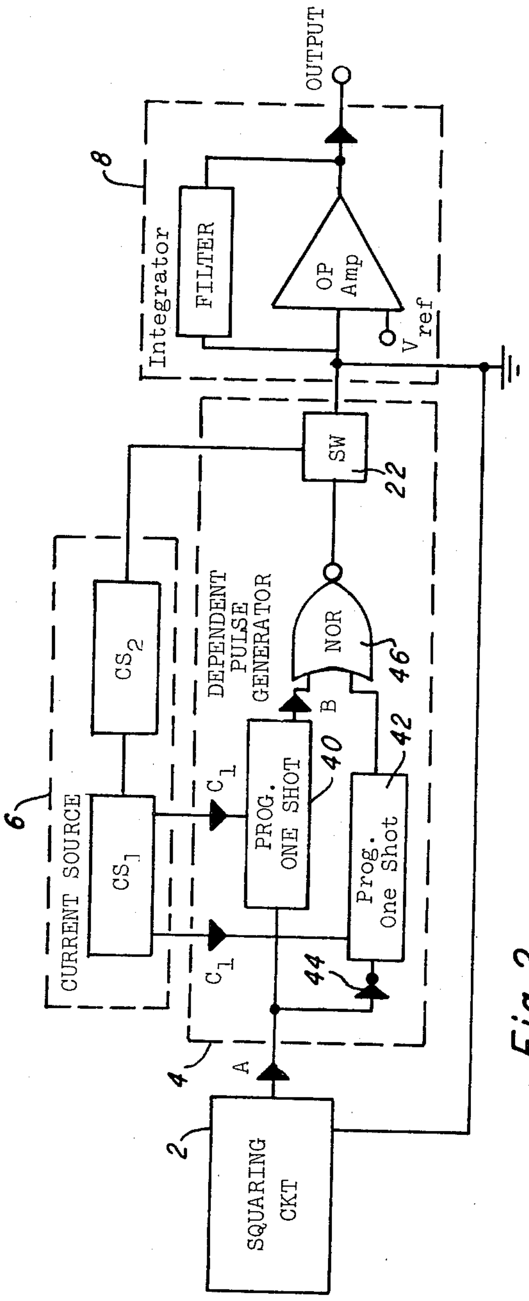
FIG. 2 depicts a second embodiment of the present invention.
Figure 4:
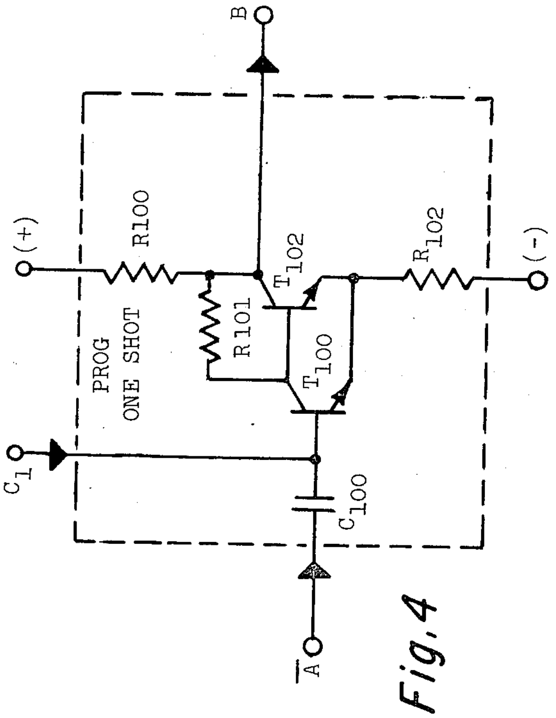
Figure 3A:
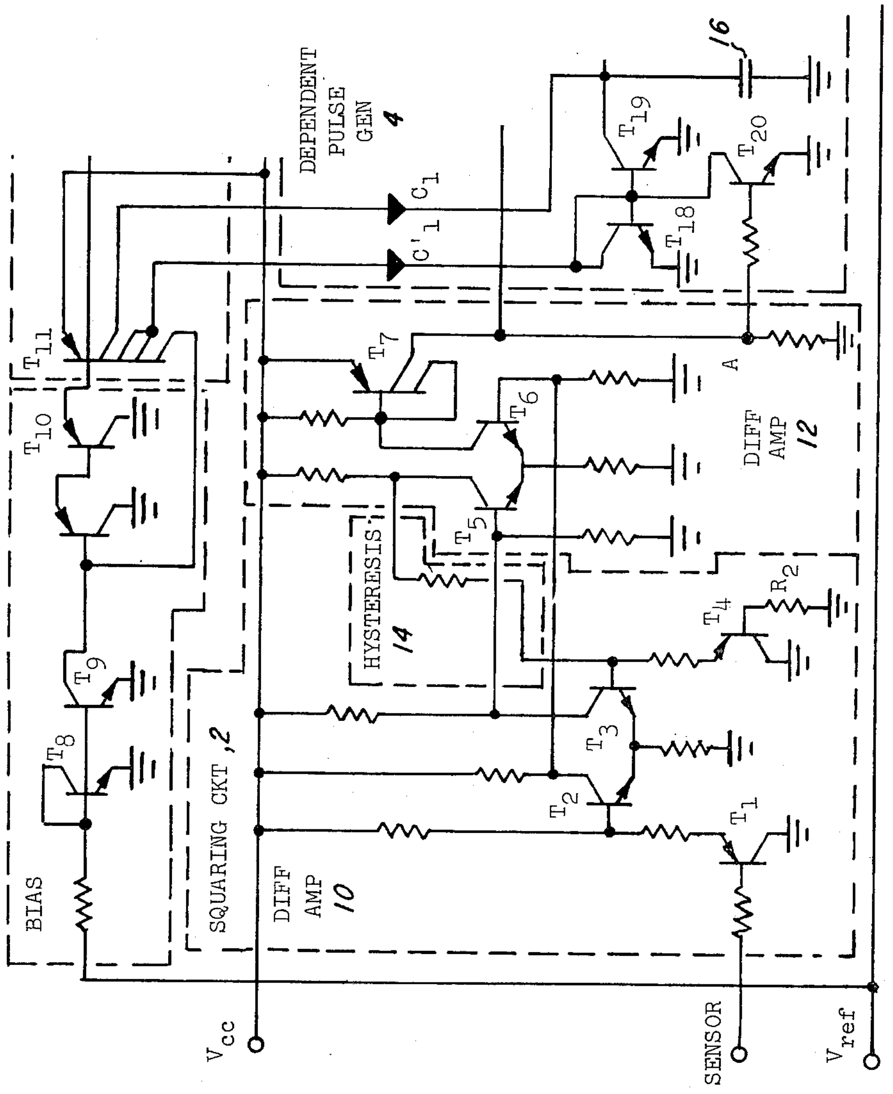
Figure 3B:
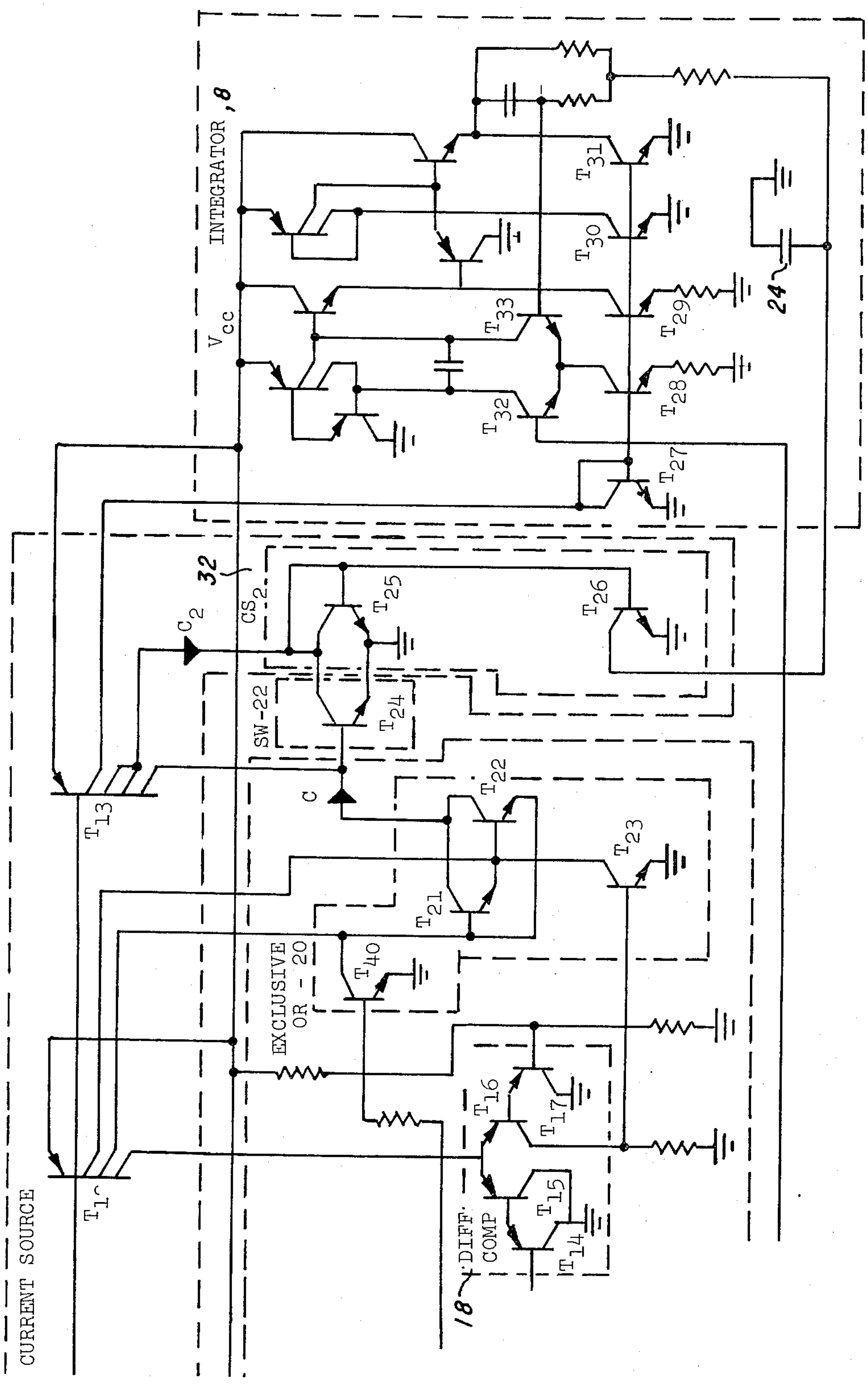
Figure 5:
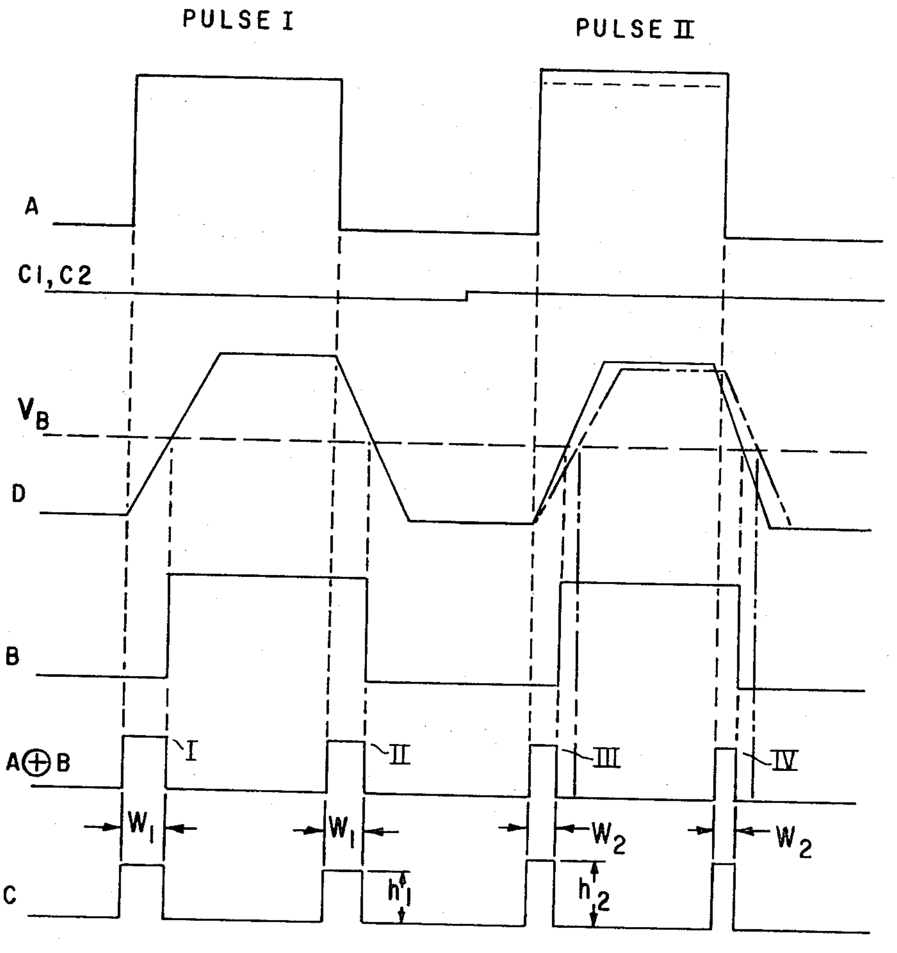

FIGS. 3*a* and 3*b* depict one specific circuit representation of the embodiment of FIG. 1;

FIG. 4 represents a specific implementation of the pulse generator subcircuit of FIG. 2; and FIG. 5 represents typical waveforms of the frequency to voltage converter of this invention.

Referring now to FIG. 1, a frequency to voltage converter is shown which is advantageously utilized in integrated circuit applications. A sensor signal, for example representative of wheel velocity in the aforementioned vehicle skid control system, actuates a squaring circuit 2 for providing a first pulse train A comprising squared pulses. The rate of occurrence of the pulses is representative of the frequency of the sensor signal.

Pulses A then actuate current source 6 and dependent pulse generator 4 which in combination provide pulse train C. The frequency of occurrence of pulses C is representative of the frequency of the sensor signal and each pulse thereof comprises width and height of inter-related proportions so as to maintain substantially constant energy in each pulse. That is, the current source 6 provides a first control signal C1 of a predetermined current amplitude to actuate the pulse generator 4 and to control pulse width of the output waveform C. Current source 6 also provides a second control signal C2 having amplitude which proportionally tracks that of control signal C1, so as to control pulse amplitude of output signal C. Energy in each of the respective current pulses of train C is inter-related by the relationship between control signals C1 and C2 such that any change in the pulse width of train C results in a corresponding and opposite change in the pulse amplitude thereof to thereby maintain equal energy per pulse. The above described converter maintains substantially equal energy per pulse over a wide frequency range which may be crucial in applications wherein the system is exposed to varying environmental conditions. For example, the aforementioned skid control system must accurately function in extreme temperature and atmospheric climates.

Integrator 8 thereupon provides DC output signal E by integrating the regulated pulse train C. By establishing a reference DC value $V_{REF}$ for output signal E representative of a zero frequency of the sensor signal, the varying magnitude of signal E thereabove is calibrated to represent instantaneous frequency. The higher the frequency of the input signal, the higher the total energy per time period actuating the integrator 8. The converter of this invention provides an accurate DC representation of frequency over a broad frequency spectrum which is highly linear from substantially zero frequency, heretofore unachievable utilizing conventional integrated circuit techniques.

Referring now to the more specific implementation of the squaring circuit 2, dependent pulse generator 4, current source 6, and integrator 8 of the frequency to voltage converter of FIG. 1, squaring circuit 2 typically comprises first and second differential amplifier means 10 and 12 coupled together in series. Hysteresis means 14 provides feedback from amplifier 12 to amplifier 10 so as to create hysteresis between the "turning on" and the "turning off" threshold voltage levels of the differential pair. Further referring to FIG. 5, there is shown the pulse train A having squared pulses representative of the cycles of the sensor signal. Squaring circuit 2 advantageously functions as a Schmitt trigger to provide the squared pulses.

Current source 6 comprises current sources 30 and current source 32 generating control currents C1 and C2, respectively, such that current C2 proportionally tracks current C1 in amplitude. That is, any disturbance or parameter variation causing a fluctuation or variation in control signal C1 also generates a like variation in control current C2. Therefore, as current C1 fluctuates causing the pulse width of pulse train C to vary, current C2 fluctuates in a compensating manner to cause an inverse variance in the pulse amplitude which renders pulses of substantially constant energy.

Dependent current generator 4 comprises differential comparator 18 responsive to control current C1 and to bias signal $V_B$. Whenever the voltage of waveform D exceeds the level established by bias signal $V_B$, pulses B are generated. A capacitor 16 controllably charged and discharged by signal C1 provides voltage waveform D having time dependent amplitude. Pulse generator 4 further comprises the Exclusive-OR logic circuit 20 for combining pulse trains A and B in an exclusive OR combination, A⊕ B.

Further included in generator 4 is switch 22 responsive to control signal C2 and to signal A⊕ B to provide the compensated pulse train C. Switch 22 is preferably a gating circuit utilizing signal A⊕B as a gate signal for selectively passing in response thereto an output signal of amplitude controlled by signal C2.

Referring again to FIG. 5, the first pulse of train A is shown exhibiting a first amplitude, and a second pulse of train A is shown exhibiting a modified amplitude, for purposes of illustration only shown as a positive increase in amplitude $\Delta h$. As noted earlier, operational current and voltage levels in integrated circuits are subject to change with environmental conditions exemplified by $\Delta h$ in pulse II of train A. Control signals C1 and C2 likewise reflect increased amplitude levels.

Threshold $V_B$ is shown in relationship to waveform D. The positive and negative slopes of waveform D are a function of the charging and discharging rate of capacitor 16, respectively, which rates are a function of control current C1. Each pulse of waveform D advantageously exhibits positive and negative slopes of substantially equal magnitude. When voltage waveform D exceeds threshold $V_B$, differential comparator 18 generates signal B. Pulse trains A and B are thereafter combined in an Exclusive-OR logic combination by the logic circuit 20 to produce A⊕ B; that is, to produce a pulse train exhibiting pulses whenever the logic states of train A and train B are opposite.

Switch 22 is utilized to selectively pass control signal C2 in response to the gating signal A ⊕ B. Pulse train C accordingly has pulses exhibiting width controlled by signal C1 and height controlled by signal C2.

Waveform D is also shown responsive to the current changing condition above mentioned. When control signal C1 increases in value, capacitor 16 charges and discharges at an increased rate. Differential comparator output signal B is accordingly modified, exhibiting a pulse II time displaced from a non-modified position. Accordingly, when signals A and B are exclusively OR combined, pulses III and IV of A⊕ B are generated of diminished width and accordingly of diminished energy.

Control signal C2, however, also increases in amplitude in response to the change and therefore when signal A ⊕ B gates signal C2 via switch 22, output signal C is generated having increased amplitude. In FIG. 4, total energy per pulse is calculated according to the formula $$\text{Energy} = w \times h \qquad \text{Eqn. 1}$$

The relationship between control signals C1 and C2 is such that $w_1 - w_2/w_1 = h_2 - h_1/h_2$. Therefore, $w_1 \times h_1 = w_2 = h_2$ or total energy per pulse is maintained constant.

Integrator 8 comprises operational amplifier 26 having filter 28 providing a feedback signal E to one of the input terminals. The other input terminal receives a reference signal, $V_{REF}$, which is adjusted so as to provide a DC output signal E representative of zero frequency when the frequency of the sensor signal is zero. The integrator 8 further comprises integrating capacitor 24 for integrating compensated signal C. The above described frequency to voltage converter is the subject matter of copending patent application "Improved Tachometer Circuit," Ser. No. 320,410, filed Jan. 2, 1973.

SECOND EMBODIMENT

Depicted in FIG. 2 is a second embodiment of the present invention utilizing a dependent pulse generator comprising programmable one-shot circuits. Squaring circuit 2, current source 6, and integrator 8 are essentially as described with respect to FIG. 1.

Dependent pulse generator 4, however, comprises first and second programmable one-shot circuits, 40 and 42, responsive to signal A and signal A inverted, respectively. Inverter 44 provides signal A inverted as the input signal to one-shot circuit 42. Current source CS1 controls the duration of the output pulse of each of the one-shots 40 and 42, while signal A actuates the one-shots to provide the pulses. The output of the one-shots is then logically NORed by logic circuit 46. The output of the NOR circuit 46 is utilized to actuate the switch 22 as above described with respect to FIG. 1 to provide an input to the operational amplifier having a compensated output controlled by current source CS2.

FIG. 4 depicts one possible programmable one-shot suitable for implementing circuits 40 and 42. Transistors T100 and T102 are connected with common emitters, and the base terminal of T102 is connected to the collector terminal of T100, while the collectors are resistively coupled. Resistors R100-R102 bias the transistor pair such that T102 is conducting when T100 is non-conducting and conversely. When the voltage on the base of transistor T100 is sufficiently increased to force T100 into the conductive state, transistor T102 becomes non-conductive until the input signal forces transistor T100 non-conductive.

When signal A increases to a logic state, transistor T100 becomes non-conductive and the voltage on the base of transistor T100 increases at a rate determined by the charging rate of capacitor C100, itself determined by the control signal C1 supplied from current source CS1. The greater the current from current source CS1, the greater the charging rate of capacitor C100. Other one-shot generators featuring programmable pulse widths are also suitable utilized within the scope of this invention.

Shown in FIG. 3 is a specific implementation of the frequency to voltage converter depicted in FIG. 1. Differential amplifier 10 comprises input transistor T1, differential pair transistors T2 and T3, and biasing transistor T4. Differential amplifier 12 comprises differential transistor pair T5 and T6 and current source transistor T7. Hysteresis circuit 14 comprises resistor R1 coupling the base of differential transistor T3 and the collector of differential transistor T5. Current source transistor T7 is a multi-collector PNP transistor having one of the multiple collectors connected to its base. Preferably the current ratio between the collectors of the multi-collector transistor is 1:1. The output of the differential amplifier 12 is developed across resistor R2 which is coupled to the other collector of current source transistor T7.

Current source 6 comprises biasing transistors T8-T10 connected so as to bias current source transistors T11-T13. Current source transistors T11-T13 are multi-collector PNP transistors having collector currents preferably in the 1:1 ratio. Transistor T11 supplies control current C1 and C1′ respectively while transistor T13 supplies control current C2 and C2′. It is noted that control current C1′ and control current C2 are generated by a respective pair of commonly connected collectors.

Differential comparator 18 in the dependent pulse generator 4 comprises transistors T14-T17. Current source transistor T12 supplies bias current to the common emitters of transistors T15 and T16 and the input to the differential comparator 18 is on the base of transistor T14.

Control current C1′ drives current transfer transistors T18 and T19 which are controlled by switching transistor T20. The collector of transfer transistor T19 is connected to control capacitor 16 and to the input of the differential comparator 18.

The output of the differential comparator is on the collector of differential transistor T16 which is coupled as an input to the exclusive OR circuit 20. The base of differential transistor T17 is resistively biased to provide a selective bias voltage $V_B$.

The exclusive OR circuit 20 comprises transistors T40 and T21-T23. The signal A input is on the base of transistor T40 while the signal B input is on the base of transistor T23. Transistors T21 and T23 have common collectors which provide the output of the exclusive OR circuit 20 providing the signal A⊕ B.

Switch 22 comprises transistor T24 having its base connected to the output of the exclusive OR circuit 20 and having its collector coupled to control signal C2 for selectively shunting it to circuit ground.

Current transfer transistors T25 and T26 have bases commonly connected to the collector of switching transistor T24 for receiving control signal C2. The collector of transfer transistor T26 provides output signal C which is subsequently integrated. It will be recognized by those skilled in the art that integrator 8 is of the type utilizing first and second sets of current sources for biasing a differential transistor pair, and the operation thereof is in accordance therewith. Integrator 8 comprises integrating capacitor 24 connected to the collector of current transfer transistor T26 and to the input of the operational amplifier. Coupling into the integrator on the collector of transistor T26 advantageously provides high impedance which improves linearity over conventional diode couplings. The operational amplifier may suitably be any operational amplifier having sufficiently high gain and low input offset voltage so as to insure linearity and frequency to voltage gain accuracy over broad temperature and frequency ranges. In FIG. 3, for example, the base of differential pair transistor T32 is coupled to receive a reference voltage $V_{REF}$ and the base of the other reference transistor T33 is coupled through the R-C filter to the integrating capacitor 24 and to the input signal C. The collector of bias transistor T31 provides the DC level signals having magnitude related to the frequency of the sensor signal.

Operation of the dependent pulse generator 4 with respect to the current generator 6 is as follows. Referring to the voltage waveform D of FIG. 5 which is developed across control capacitor 16, input signal A actuates switching transistor T20 which controls current transfer transistors T18 and T19. When signal A drives switching transistor T20 conductive, current transfer transistors T18 and T19 are driven non-conductive. In response thereto control current C1′ is shunted through switching transistor T20 to circuit ground, and current C1 charges capacitor 16. Control current C1 is one-half the magnitude of control current C1′, as control current C1′ is generated by a pair of commonly connected collectors having a collector current ratio of 1:1. Capacitor 16 charges according to $$i = c\, dv/dt \qquad \text{Eqn. 2}$$

wherein $i$ = current C1 which is substantially constant. Accordingly the positive slope of waveform D ($dv/dt$) is constant and controlled by current C1. The larger the value of the capacitor 16 or the smaller the control current C1, the less is the positive slope of waveform D.

When input signal A becomes a logic low to force switching transistor T20 into the non-conductive state, transistors T18 and T19 become conductive to conduct control currents C1' and C1 to circuit ground. The transfer transistors T18 and T19, having commonly connected bases and commonly connected emitters, with the collector of transistor T18 tied back to the common bases, function to provide and maintain equal currents in the respective collector-emitter paths thereof. However, current source transistor T11 is supplying twice as much current in control current C1' as in control current C1. Accordingly, transistor T19 draws the difference of C1' − C1 current from control capacitor 16. As control currents C1' and C1 are normally constant in magnitude, the amount of current generated from capacitor 16 is also constant, as determined by Eqn. 2. Accordingly, the rate of voltage decay of capacitor 16, the negative slope of waveform D, is controlled by the difference between control currents C1' and C1, which is substantially equal in value to current C1. The negative-going slope of waveform D is substantially constant and equal in magnitude to that of the positive-going slope, as capacitor 16 is either being charged or discharged by a relatively constant amount of current. As will be shown later, the C1 amount of current, whether constant or slightly varied due to any of a plurality of environmental conditions, is directly proportional to control current C2 which actuates integrating capacitor 24 and the operational amplifier.

Signal D thereupon actuates differential comparator 18, and when it exceeds in amplitude the bias voltage on the base of differential transistor T17, $V_B$, transistor T16 conducts to provide output signal B on the collector thereof. In effect, signal B is representative of signal A having time displacement determined by the positive and negative slopes of signal D.

Signal A and signal B are thereupon exclusively OR combined by the logic circuit 20 to provide signal C to the base of switching transistor T24. Switching transistor T24 is actuated upon the logic condition that signal A is opposite in logic state from that of signal B.

Signal C thereupon actuates switching transistor T24 of switch 22 whenever transistor T24 becomes conductive, and control current C2 is shunted therethrough to ground. Current transfer circuit CS2 is thereupon deactuated causing a logic zero input to the integrator 8.

When switching transistor T24 becomes nonconductive to allow control current C2 to flow through current transfer circuit CS2, current transfer transistor T26 maintains a like amplitude of current therethrough. This amplitude which is substantially equal to that of control current C2 is thus substantially equal to control current C1 and accordingly tracks current C1 and any changes therein. Control current C2 thus controls the amplitude of the pulse integrated by integrator 8, and control current C1 essentially controls the pulse width of the input to the integrator.

Thus, even though control currents C1 and C2 may vary, they track or follow each other so as to maintain a constant total energy per pulse as an input signal to the integrator 8. Energy is essentially that which the operational amplifier measures to provide the DC signal output which is representative of the frequency of the sensor signal input.

The above described frequency to voltage converter, utilized in an integrated circuit so as to provide a constant gain to the integrator notwithstanding changing environmental conditions or even variances in reproducibility inherent in integrated circuit processing, is also advantageously utilized in that it only requires a minimum number of discrete capacitors to provide the overall function. Not only is cost reduced by reducing the number of externally supplied components, but also oftentimes crucially needed space becomes available for other applications.

Although preferred embodiments of the invention have been described in detail, it is to be understood that various changes, substitutions and alterations can be made therein without departing from the spirit and scope of the invention as defined by the appended claims.

What is Claimed is:

1. A frequency converter responsive to a variable frequency signal comprising:

a. squaring circuit means responsive to said variable signal for generating a first train of squared pulses having frequency related to the frequency of said variable signal and having an amplitude switching between first and second states;

b. pulse generator means responsive to said first train of pulses for generating a second train of pulses, each pulse thereof characterized as being actuated by a change of state of said first train and further having selectively programmable width;

c. first current generator means for supplying a first control signal to said pulse generator means for controlling pulse width of the pulses thereof and for supplying a second control signal having amplitude directly related to said first control signal;

d. switching means responsive to said second pulse train and to said second control signal for generating a third pulse train in direct frequency proportion thereto, and having an amplitude controlled by said second control signal which is dynamically related to said first control signal, whereby a pulse width change in said second pulse train is offset with an amplitude change in said third pulse train to thereby generate all pulses in said third train having substantially equal energy therein; and e. integrator means responsive to said third pulse train for generating a DC signal having a magnitude related to and varying with the frequency of said variable signal.

2. The combination of claim 1 wherein said pulse generator means comprises a one-shot generator for providing pulses in response to a change of state of said first pulse train and having pulse width controlled by said first control signal.

3. The combination of claim 1 wherein said pulse generator means comprises:

a. a first one-shot generator responsive to said first pulse train for generating first logic pulses having width controlled by said first control signal;

b. means for inverting said first pulse train;

c. a second one-shot generator for providing second logic pulses responsive to said inverted first pulse train; and d. logic NOR circuit means for logically NORing said first and second logic pulses to thereby provide said second pulse train.

4. The combination of claim 3 wherein each of said one-shot generators includes a capacitor electrically actuated by said first control signal for controlling pulse width of said second pulse train.

5. The combination of claim 4 wherein said integrator means comprises:

a. a capacitor selectively actuated by said switching means; and b. an operational amplifier coupled to said capacitor for providing said DC signal.

6. The combination of claim 1 wherein the pulse width of said third pulse train is substantially equal to the respective pulse width of said second pulse train.

7. The combination of claim 6 wherein the components comprising said frequency converter are included in an integrated circuit.

8. The combination of claim 1 wherein said switching means includes an output transistor having a collector terminal coupled to said integrator means for providing a relatively high impedance thereto.

* * * * *